United States Patent [19]

Abys et al.

[11] Patent Number: 5,360,991
[45] Date of Patent: Nov. 1, 1994

[54] INTEGRATED CIRCUIT DEVICES WITH SOLDERABLE LEAD FRAME

[75] Inventors: Joseph A. Abys, Warren; Igor V. Kadija, Ridgewood; Edward J. Kudrak, Jr., Clifton; Joseph J. Maisano, Jr., Denville, all of N.J.

[73] Assignee: AT&T Bell Laboratories, Murray Hill, N.J.

[21] Appl. No.: 99,118

[22] Filed: Jul. 29, 1993

[51] Int. Cl.$^5$ .................... H01L 23/48; H01L 29/40; H01L 29/44; H01L 29/46
[52] U.S. Cl. .................... 257/666; 257/736; 257/734; 257/762; 257/766; 257/767; 257/781
[58] Field of Search ............ 257/666, 668, 692, 693, 257/734, 735, 736, 762, 766, 767, 781

[56] References Cited

U.S. PATENT DOCUMENTS

| | | | |
|---|---|---|---|
| 4,268,849 | 5/1981 | Gray et al. | 257/766 |
| 4,911,798 | 3/1990 | Abys et al. | 204/44 |
| 4,911,799 | 3/1990 | Abys et al. | 204/44.6 |
| 4,917,967 | 4/1990 | Cupolo et al. | 428/669 |
| 5,178,745 | 1/1993 | Abys et al. | 205/219 |

FOREIGN PATENT DOCUMENTS

| | | | |
|---|---|---|---|
| 00268562 | 4/1989 | European Pat. Off. | 257/766 |
| 0250146 | 12/1987 | United Kingdom | H01L 23/48 |
| 0335608 | 10/1989 | United Kingdom | H01L 23/50 |

OTHER PUBLICATIONS

"Gold Plating Technology", Electrochemical Publications Limited, 1974, Anchor Brendon Limited, Tiptree Essex, Great Britain.
"Solderability", Mil-Std-883C, Notice 5, Method 2003.5, May 29, 1987.
"Standard Test Method for Porosity in Gold and Palladium Coatings by Sulfurous Acid/Vapor$^1$", ASTM Designation: B799-88, Nov. 1988, pp. 463-465.

Primary Examiner—Andrew J. James
Assistant Examiner—Carl Whitehead, Jr.
Attorney, Agent, or Firm—Oleg E. Alber

[57] ABSTRACT

A packaged device with a lead frame, a lead frame and an article of manufacture comprising a base metal, a layer of nickel on the base metal, and a protective composite of metal layers on the nickel. The composite includes, in succession from the nickel layer, a layer of palladium or soft gold strike, a layer of palladium-nickel alloy, a layer of palladium and a layer of gold. The palladium or soft gold strike layer acts primarily as a bonding (an adhesive) layer between the Ni and Pd-Ni alloy layers and as a layer that enhances reduction in porosity of subsequent layers, Pd-Ni alloy layer acts as a trap for base metal ions, Pd layer acts as a trap for Ni ions from the Pd-Ni alloy layer, and the outer gold layer synergistically enhances the quality to the Pd layer. The various layers are in thickness sufficient to effectively accomplish each of their designated roles, depending on the processing and use conditions. Pd on soft Au strike layer may be 1-5 microinches thick, Pd-Ni alloy layer from 4 to 100 microinches, Pd layer from 1 to 100 microinches and the outer gold layer from 1 to 100 microinches in thickness.

24 Claims, 3 Drawing Sheets

INTEGRATED CIRCUIT DEVICES WITH SOLDERABLE LEAD FRAME

TECHNICAL FIELD

This invention concerns integrated circuit devices in which an integrated circuit unit and a lead frame are sealed within a protective enclosure.

BACKGROUND OF THE INVENTION

Integrated circuit (IC) devices, having an integrated circuit (IC) unit and a lead frame which are sealed within a protective enclosure, find wide use in products including consumer electronics, household appliances, computers, automobiles, telecommunications, robotics and military equipment. The IC unit encompasses integrated circuit chips and hybrid integrated circuit modules which include one or more of the IC chips and other electronic components on a plastic or ceramic support base.

A means to electrically interconnect an IC unit to circuitry external of the IC device takes the form of a lead frame. The lead frame is formed from a highly electrically conductive material, such as copper, copper alloy or an iron-nickel alloy, by stamping or etching a metal blank into a plurality of leads (or lead fingers) defining a central area in which the IC unit is mounted. The lead frame comprises typically a mounting paddle and a plurality of separate lead members extending away from a location adjacent to the paddle. In those instances where the paddle is absent, the leads are formed so that the IC unit is supported by the ends of the leads or the ends of the leads are positioned in an abutting or spaced position with the IC unit or the ends of the leads are overlapping the periphery of the IC unit.

The blanked lead frames are, typically, plated in a conventional manner with a layer of nickel over the surface of the lead frame. Nickel plating was intended to serve as a barrier to diffusion of copper to and formation of reactive copper products, such as copper oxides and sulfides, on the surface of the lead frame. Unfortunately, nickel layer in thickness of less than 400 microinches (10.2 micrometers) contains pores through which migration and diffusion of copper to the surface of the lead frame takes place. However, a layer having thickness of greater than 400 microinches tends to crack when the leads are eventually bent.

An attempt to eliminate or at least reduce effects of diffusion of copper through a less than 400 microinches thick nickel layer was made by depositing a thin layer of palladium or palladium/nickel alloy on top of the nickel layer. (See European Patent Application No. 0 250 146 published Dec. 23, 1987). However, copper corrosion products, including oxides, sulfides and other reaction products of copper, continued to appear on the lead frame, discoloring the surface of the lead frame and degrading its solderability. A further attempt to overcome these shortcomings was made by plating the copper base with a plurality of layers including, in an ascending order from the copper base, a 5 microinch (127 nanometers) thick nickel strike layer, a 3 microinch (76 nanometers) thick palladium/nickel alloy layer, a nickel layer and a palladium layer. The nickel strike layer and the palladium/nickel alloy layer were intended to act as a barrier to copper ion migration to the surface of the lead frame so as to permit the use of a thinner (less than 400 microinches) nickel layer. (See European Patent Application No. 0 335 608 published Oct. 4, 1989). However, this combination of layers also did not lead to a product which could withstand the effects of processing steps required in the process of fabrication of the encapsulated devices. Therefore, there is a need for a coating or a combination of coatings which could provide satisfactory coverage of base metals.

SUMMARY OF THE INVENTION

The present invention embodies a packaged device with a lead frame, a lead frame and an article of manufacture comprising a base metal, a layer of nickel on the base metal, and a protective composite of metal layers on the nickel. The composite includes, in succession from the nickel layer, a layer of palladium or soft gold strike, a layer of palladium-nickel alloy, a layer of palladium and a layer of gold. The palladium or soft gold strike layer acts primarily as a bonding (an adhesive) layer between the Ni and Pd-Ni alloy layers and as a layer that enhances reduction in porosity of subsequent layers, Pd-Ni alloy layer acts as a trap for base metal ions, Pd layer acts as a trap for Ni ions from the Pd-Ni alloy layer, and gold layer synergistically enhances the quality to the Pd layer. The various layers are in thickness sufficient to effectively accomplished each of their designated roles. depending on the processing and use conditions. Pd or Au strike may be deposited in thickness from 1 to 5 microinches, Pd-Ni alloy from 4 to 100 microinches, Pd from 1 to 100 microinches and the outer gold layer from 1 to 100 microinches in thickness.

DETAILED DESCRIPTION

Figure 1:
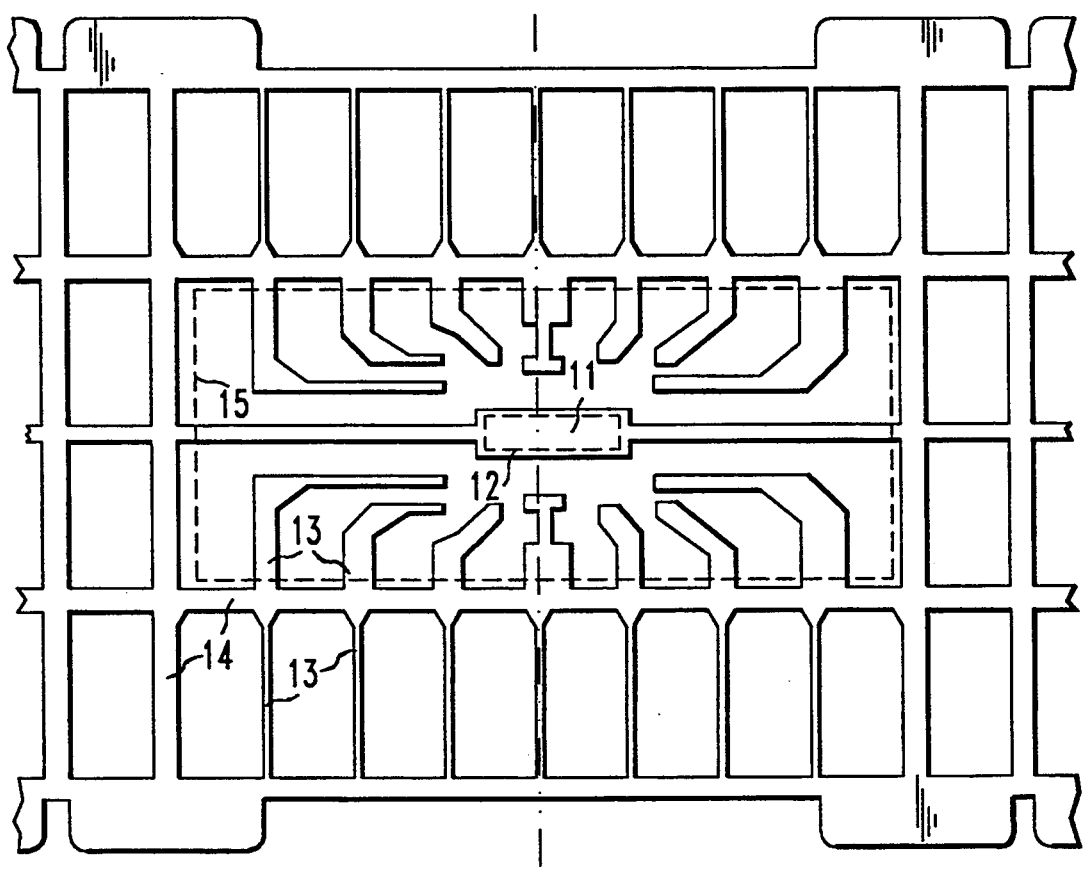
FIG. 1 is a schematic representation of a top view of a typical lead frame with an IC unit mounted thereon.

FIG. 1 illustrates a top view of a typical lead frame, 10, for use with an integrated circuit (IC) unit, 11. The lead frame includes a paddle, 12, on which the IC unit is bonded, and leads, 13. Dam bars, 14, which interconnect leads 13 at this stage, are trimmed away after a packaging medium has been applied over an area shown in phantom lines, 15.

For illustration purposes, this invention will be described with reference to an IC packaging in which the packaging medium is a molded plastic material, such as epoxy. However, this invention is applicable to such other embodiments in which the IC unit and the leads are enclosed in a ceramic or a hybrid ceramic and metallic package.

Figure 2:
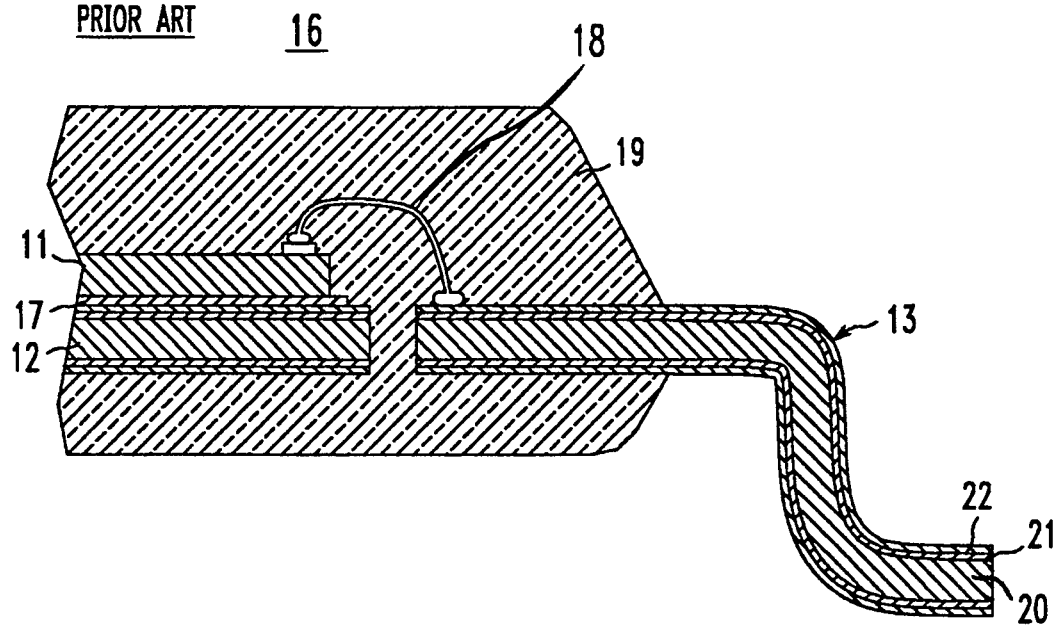
FIG. 2 is a schematic cross-sectional side view of a portion of an encapsulated device taken along the 2—2 line of FIG. 1.

In FIG. 2 is shown a schematic cross-sectional side view of a package 16. The package includes IC unit 11, paddle 12, and leads 13. The IC unit which is bonded on the paddle by solder or adhesive, 17, is electrically connected via wires or tabs 18, to the leads. IC unit 11, paddle 12, wires 18, and portions of the leads adjacent to the paddle are enclosed in a molded packaging medium, 19. The leads include a base metal, 20, a layer of nickel, 21, on the base metal, and a protective composite, 22, on the nickel layer.

The base metal, 20, is typically a copper or a copper alloy. Copper alloys, such as CDA No. 102 (99.95% Cu, remainder including Ag), CDA No. 103 (99.95% Cu, plus 0.001–0.005 P, and Au), No. 151 (99.9 Cu, 0.1% Zn), No. 155 (97.8 Cu, 0.034 Ag, 0.058 P, 0.11 Mg), No. 194 (97.5 Cu, 2.35 Fe, 0.003 P, 0.12 Zn), and KLF 125 (94.55 Cu, 3.2 Ni, 1.25 Sn, 0.7 Si), are representative of the materials being used for the lead frames. Other alloys, such as iron-nickel alloys may also be used as the base metal.

The above-identified EP patent applications were primarily concerned with metal coatings suitable for preventing or at least reducing diffusion of copper and copper products from the base metal to the surface of the leads of the lead frame. However, presence of nickel and nickel products, such as nickel oxide, at the surface of the leads are of greater concern from the solderability standpoint than the presence of copper and copper products. Presence of as little as 5 atomic percent or less of nickel on the surface detrimentally affects the solderability of the surface. Nickel and nickel products, due to the effects of various processing steps, including high temperature and oxidation conditions, diffuse to and inter-react with metal components of the overlaying layers. Nickel products, such as nickel oxides, interfere with soldering and bonding processes. Besides, they are difficult to remove with conventional acidic cleaning.

Figure 3:
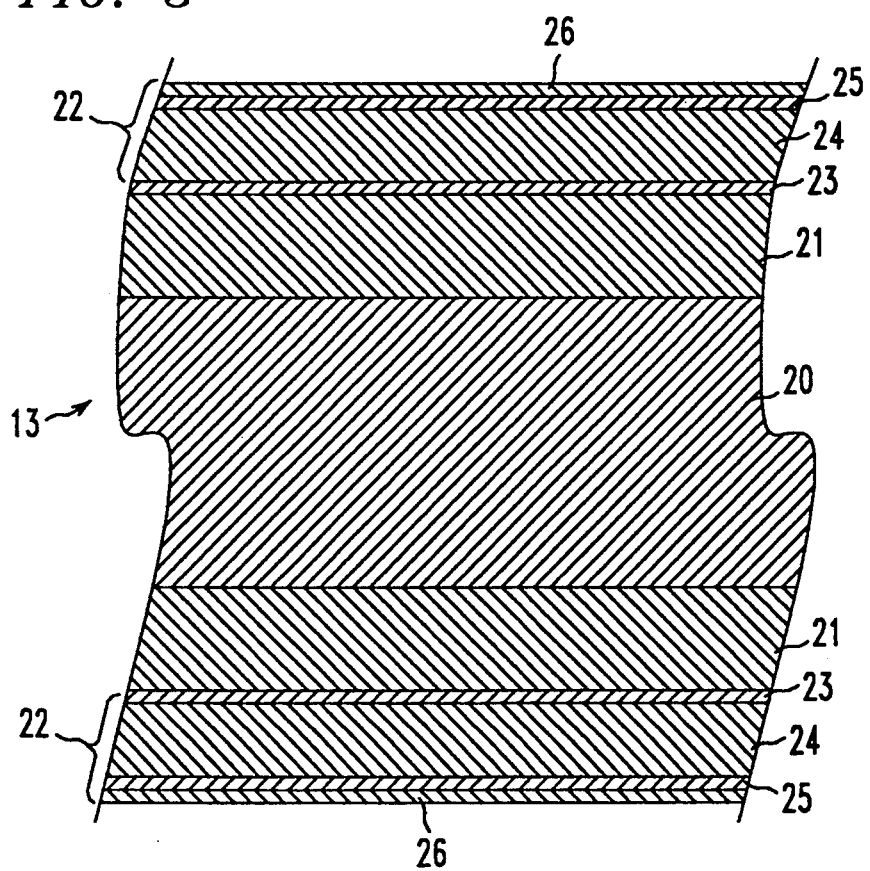
FIG. 3 is an enlarged schematic representation of a cross-section of a small longitudinal portion of the lead showing the layers of the composite plating according to the invention.

This problem is solved by depositing on top of nickel layer 21 protective composite 22 having a multilayer structure which in a total thickness of about 10 microinches and more prevents or at least substantially reduces migration of copper and copper products and of nickel and nickel products onto the outer surface of the leads. Shown in FIG. 3, is an enlarged schematic representation of a cross-section of a portion of lead 13. Composite 22 includes, in an ascending order from nickel layer 21, a palladium or soft gold strike layer 23, a palladium nickel alloy layer 24, a palladium layer 25, and a gold layer, 26. The composite is deposited in a total thickness varying from about 10 microinches to 300 microinches and thicker. The composite is on a nickel layer ranging typically from 20 to 200 microinches in thickness (510 to 5100 nanometers).

Palladium or soft gold strike layer 23, which acts as a bonding (adhesive) layer between nickel and palladium-nickel alloy layer is deposited in a thickness ranging from 1 to 5 microinches (25 to 102 nanometers). Layers thinner than 1 microinch may be insufficient for bonding purposes, while layers 5 microinches and thicker would not add any additional advantage. Pd or Au strike layer is a low porosity layer which, in addition to its bonding characteristics, contributes to an enhancement in growth of subsequent layers with reduced porosity, which in turn contributes to the reduction in potential diffusion of copper and nickel toward upper layers. Preferably, Pd strike layer is deposited from a palladium strike solution described in U.S. Pat. No. 4,178,475 issued on Jan. 12, 1993 to J. A. Abys et al., which is incorporated herein by reference. Examples of compositions and electroplating conditions for depositing soft gold are disclosed in a book by Frank H. Reed and William Coldie, "Gold Plating Technology", Electrochemical Publications Limited, 8 Barns Street, Ayr, Scotland, Third printing 1987, pages 26 and 46.

Palladium nickel alloy layer 24 is deposited in a thickness ranging from 4 to 100 microinches (127 to 2540 nanometers). Palladium nickel alloy layer, grown on the palladium or soft gold strike layer, is a low porosity layer. The main purpose of this layer is to prevent or at least reduce diffusion of copper, iron and nickel and their products, such as oxides, to the surface of the leads, especially to the surface which is to be soldered. Layers thinner than 4 microinches may be insufficient to act as a barrier to diffusion of copper and nickel therethrough, while layers thicker than 100 microinches would not add any additional advantage. The alloy is a Pd-Ni alloy with nickel content ranging from 10 to 90, preferably from 10 to 30 percent Ni, by weight. The alloy is deposited preferably from a palladium electroplating solution described in U.S. Pat. Nos. 4,911,798 and 4,911,799 both of which were issued on Mar. 27, 1990 to J. A. Abys et al., and both of which are incorporated herein by reference.

Palladium layer 25, is deposited in a thickness ranging from 1 to 100 microinches (25 to 2540 nanometers). The main purpose of this layer is to further reduce effects of porosity in the under-lying layers and to prevent or at least to slow down diffusion of nickel from palladium nickel alloy layer 24 to the surface which is to be used for soldering. Layers thinner than 1 microinch may be insufficient to act as a barrier to the diffusion of nickel from the palladium nickel alloy layer, while layers thicker than 100 microinches would not add any additional advantages. The thickness of this layer depends on the thickness and the Ni content in the Pd-Ni alloy layer. The higher the Ni content in the alloy layer, the thicker the Pd layer should be to prevent or at least to slow down the diffusion of Ni into and through the Pd layer. The alloy is preferably deposited from palladium electroplating solution described in U.S. Pat. No. 4,911,799 issued on Mar. 27, 1990 to J. A. Abys et al., which is incorporated herein by reference.

Gold layer 26 is deposited in a thickness ranging from 1 to 100 microinches (25 to 2540 nanometers). Layers thinner than 1 microinch may be insufficient to provide in combination with the other layers of the composite a desired diffusion barrier effect while layers thicker than 100 microinches may add additional expense of the costly gold without adding any additional advantages in solderability, solder wettability and bondability of the outer surface. For economical reasons, the use of the expensive gold layer may for most purposes, be kept at a minimum such as at 1 or 2 microinches (25 to 51 nanometers). The gold layer may deposited from any conventional solutions for electroplating gold. Preferably, the gold layer is deposited as a soft gold strike. Examples of compositions and electroplating conditions for depositing soft gold are disclosed in a book by Frank H. Reed and William Goldie, "Gold Plating Technology", Electrochemical Publications Limited, 8 Barns Street, Ayr, Scotland, Third printing 1987, pages 26 and 46.

When the composite is to be used in processing at temperatures of 250° C. and less, Pd or Au strike layer may be deposited in a thickness of at least one microinch, the Pd-Ni alloy layer in a thickness of not less than 4 microinches, the Pd layer in a thickness of at least 1 and preferably at least 3 microinches, and the outer gold layer in a thickness of at least 1 microinch. For processing requiring temperatures approaching 450° C., the Pd or Au strike may be within the range of from 1 to 5 microinches, while the minimum thickness of the Pd-Ni alloy layer, Pd layer and outer gold layer are increased to a range of from 20 to 30 microinches each.

After completing the metal deposition, the lead frames undergo the IC unit mounting process. IC units 11 are mounted on paddle portions 12 of lead frames 10 in a known manner, e.g., by solder or by an adhesive. The electrical connection is made between the IC units 11 and leads 13 by means of wires or tabs 18. It is important that the surface of the leads be bondable to the wires. A solderable surface, which is free of undesirable products of copper and/or nickel, will be also suitable for bonding of wires thereto. A surface with undesirable products of copper or nickel may not be wire bondable or may be poorly bondable so that a viable connection may not be established or if established it could become disconnected in operation. Especially poor contact would be made if the outer surface of the lead at the place of bond has a thin layer of nickel oxide. Copper products, such as oxides and sulfides, are removable by cleaning the surface prior to the IC unit mounting, wire bonding and soldering. However, such nickel by-products as nickel oxides are quite tenacious and are hard to remove with conventional cleaning solutions.

Each assembly is then placed in a molding apparatus, and plastic encapsulating material is injected around each IC unit and adjacent parts of the leads and forms an external IC unit package. After removing the assembly from the molding apparatus, the molded IC packages are separated from the lead frames by separating the ends of the leads from the lead frame and by removing dam portions between the leads. The leads are then bent into a desirable configuration, e.g., gull wing, "J" or butt form. Portions of the leads exposed from the molding compound are cleaned by acid washing and soldered to pads on a mounting board. In one instance the cleaned leads are placed in contact with solder bumps or solder paste on the mounting board and are soldered to pads on the board by refluxing. In another instance, the cleaned leads are immersed into a molten bath of solder and then are placed in contact with fluxed terminal pads on the mounting board.

It is imperative that to have reliable connection between the IC unit and the mounting board, the leads should have solderable surface. This means that the surface of these portions of the leads which are to be secured to pads on the board should be capable to receive a substantially continuous coating of solder. A surface with a solder coating covering 95% or more of the area to be soldered is acceptable as being solderable. Also, the surface should have a solder coverage with a low count of pores per square centimeter, such as fewer than 28–30, preferably fewer than 25 pores per square centimeter.

In the process of fabricating the encapsulated device, the lead frame undergoes numerous processing operation steps including those which contribute to oxidation, interdiffusion contamination, contamination by vapors, cracking, and contamination surface damaging. The processing steps include injection molding of thermoplastic material to form a plastic frame (150° C., 30 minutes), circuit attachment, heat spreader attachment (150° C., 30 minutes), trim and form leads, oxygen plasma clean or laser $H_2O_2$ clean to remove any organic impurities, device attachment including die bond epoxy cure (165° C., 1 hour), cover attach (165° C., 1 hour), and burn-in (125° C./24 hours) to effect structure stress release and integrity test. These processing steps are well known in the art and do not need any further detailing. Formation of plastic molded packaging and soldering steps may involve temperatures as high as 250° C. The processing of ceramic packaging which includes encapsulation with low-melting glasses may exceed 400° C., falling into a temperature range of 400° to 800° C. for a period of 0.5 hour and longer. These processing steps and resultant unfavorable thermal and oxidation effects on the material of the lead frame result in reduced solderability quality of the lead frame.

To determine whether or not the surface of the lead frame would be suitable for a reliable connection, the lead frames with or without the encapsulating material are subjected to reliability tests. One of the tests is a Military Specification 883C, Method 2003 which is used as a qualifying criterion for acceptability. This standard involves steam aging at 95° C. and 95% relative humidity for 4, 8 or 16 hours. This is presumed to simulate a shelf life of at least 6 months. Thereafter, the samples are subjected to an application of non-activated rosin-flux to exposed metal leads and immersion in solder at 250° C. for 5 seconds. Samples are then evaluated for solder coverage at 10× magnification. Coatings to be solderability acceptable must have at least 95% coverage of high-quality smooth solder with a porosity count of fewer than 28–30, preferably fewer than 25 pores per square centimeter. Although developed for typical solder finishes, the steam aging test method is applicable in testing non-solder finished substrates as well. The testing is conducted as if the surface being tested would receive a coating of solder. The porosity testing is conducted using $SO_2$ vapor as outlined in ASTM B799-88, November 1988, pages 463–465.

Since many applications include thermal exposure of the coated lead frame, diffusion of metal between the layers under thermal aging conditions may cause a loss of surface quality if the underlying metal diffuses into the more noble surface layer, e.g., nickel into gold. Therefore, in addition to steam aging, it is desirable to subject the plated surfaces to a thermal aging. Standardized thermal aging requirements do not exist at the present time. In order to judge the suitability of the coatings according to this invention for solderability under different thermal conditions, the coatings were subjected to thermal testing at 150° C., 200° C. and 250° C. for a period of 1, 2 and 5 hours, and at 450° C. for one hour.

The thermal testing was conducted on copper panels having a 20 microinch thick nickel layer coated with a composite having a total thickness of 11 microinches. The composite included, in succession from the nickel layer, a 3 microinch Pd strike layer, a 4 microinch Pd-Ni (80/20) alloy layer, a 3 microinch Pd layer and a 1 microinch soft gold flash. The sample had greater than 98% solder coverage, as plated. The sample retained its >98% solder coverage when thermally treated at 200° C. for a period of 1, 2 and 5 hours and at 250° C. for a period of 2 and 5 hours. The solder coverage also remained as high (>98%) when the sample was steam aged (95° C., 95% humidity) for 8 hours.

For comparison, samples were tested having the same Pd strike, Pd-Ni alloy and Pd thicknesses, but no outer soft gold flash. These samples, rated >98% solder coverage, as plated, were rated at greater than 98% when exposed at 200° C. for periods of 1 and 2 hours, and greater than 95% when exposed at 200° C. for a period of 5 hours but fell to an unacceptable value of less than 90% when exposed at a temperature of 250° C. for periods of 2 and 5 hours. Steam aging for 8 hours also reduced the solderability to a value of less than 90%.

Figure 4:
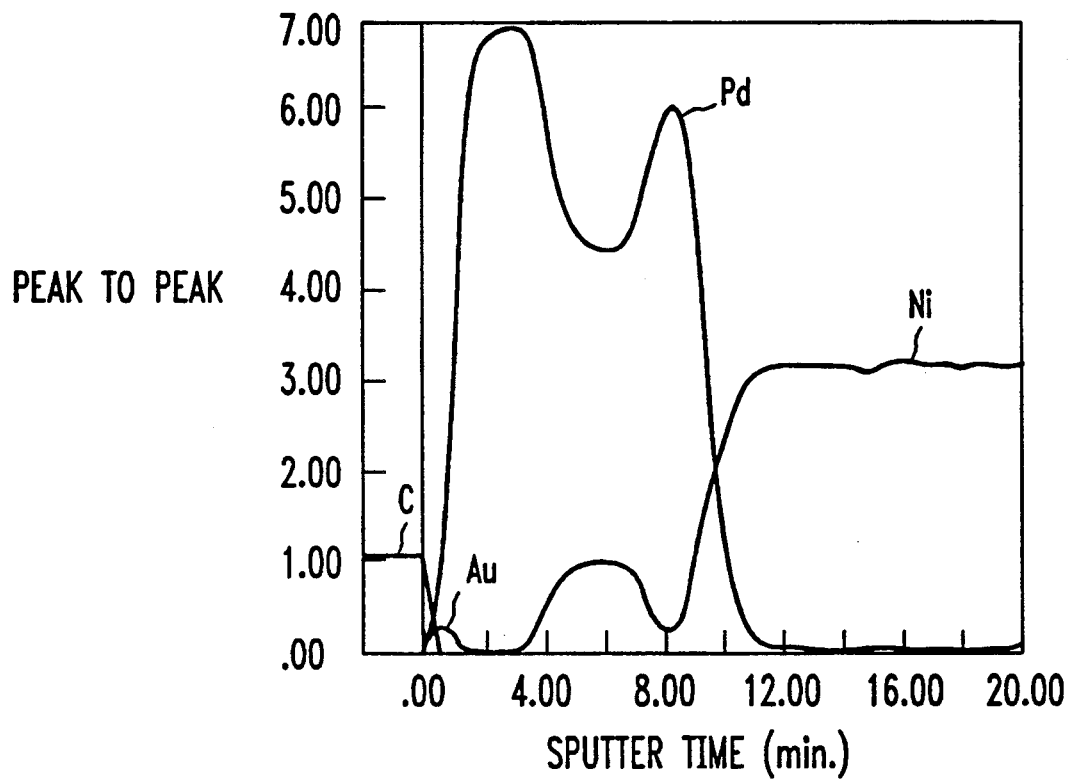
FIG. 4 is a plot of an Auger depth profile analysis of a composite according to the invention after being subjected to heat treatment at 250° C. for 5 hours.
Figure 5:
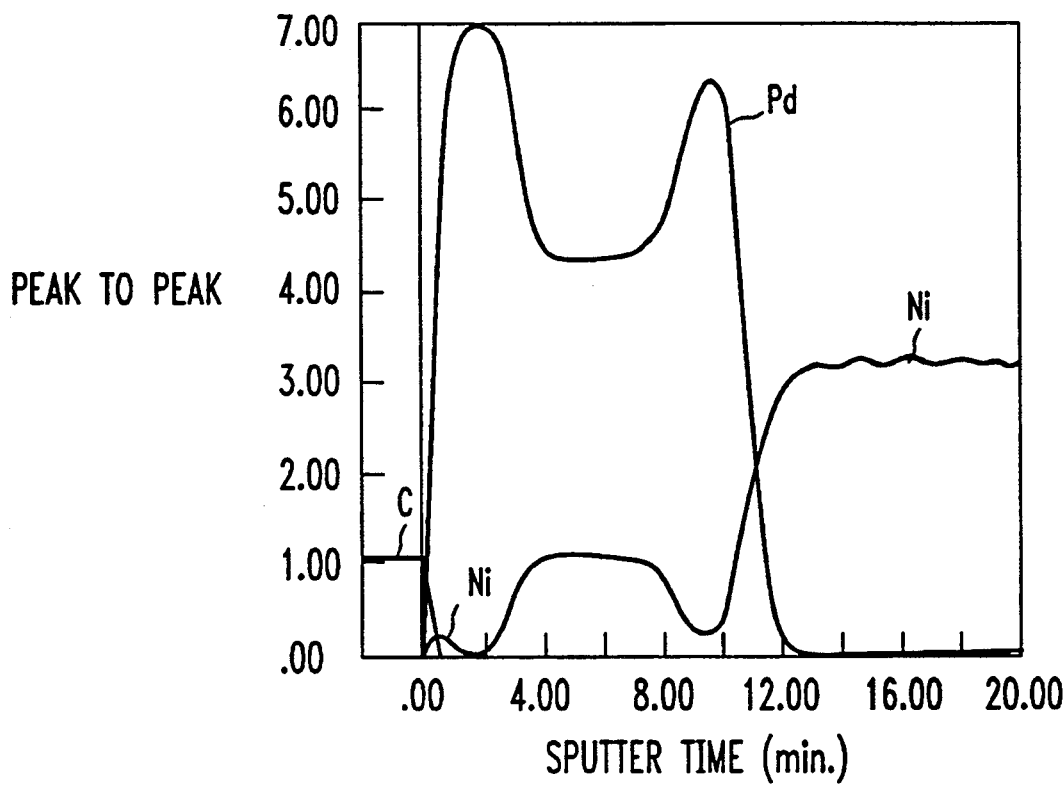
FIG. 5 is a plot of an Auger depth profile analysis of a composite without gold flash after being subjected to heat treatment at 250° C. for 5 hours.

In FIGS. 4 and 5 are shown plots of an Auger depth profile analysis of a composite having the multilayer composition with in succession from a 20 microinch nickel layer, a 3 microinch Pd strike layer, a 4 microinch Pd/Ni alloy (80/20) layer, a 3 microinch Pd layer and 1 microinch of soft gold layer. The composite was subjected to a thermal heat treatment at 250° C. for 5 hours. The sputtering for analysis after the heat treatment was conducted at a rate of 20 nanometers per minute. It is seen from FIG. 4 that no nickel is detected in the Pd layer for a period of about 3.5 minutes which corresponds to a Pd layer thickness of about 70 nanometers (approximately 3 microinches). However, FIG. 5 reveals that when a composite with Pd strike layer, Pd-Ni alloy layer and Pd layer of the same thickness as above, but without an outer soft gold layer, is analyzed, Ni is present at the surface of the Pd layer. Thus, in 5 hours at 250° C. nickel from Pd-Ni alloy will diffuse into the surface layer of a 2–3 microinches thick palladium layer and interfere with solderability. However, a 1 microinch thick layer of gold on top of the palladium layer prevents such diffusion and allows perfect solderability. A similar situation would arise when the composite with and without the outer gold layer is subjected to much higher temperatures. For example, in another experiment after 1 hour at 450° C., nickel penetrated through 20 microinches of Pd and 3 microinches of gold. This penetration was eliminated and complete solderability achieved by introducing 20 microinches of gold on top of 20 microinches of palladium. In comparison, 100 microinches of gold alone, that is without the Pd strike, Pd-Ni alloy and Pd layers, on top of nickel could not prevent the loss of solderability after thermal exposure at 450° C. for only 10 minutes.

In another specific exemplary embodiment individual layers of composite 20 were deposited in succession upon the surface of nickel layer 19. The composite was deposited in a total thickness of about 12 microinches (about 310 nanometers) upon a nickel layer 20 microinches (510 nanometers) in thickness.

TABLE I

| Layer | Combination No. | | |
|---|---|---|---|
| | 1 | 2 | 3 |
| | Thickness in microinches | | |
| Pd Strike | 1 | 1 | 2 |
| Pd/Ni alloy | 7.5 | 7.5 | 7.5 |
| Pd | 1 | 2 | 1 |
| Au Strike | 2 | 1 | 1 |

The following layered finish, identifiable as combination No. 4 representative of prior art coatings, was used as a control:

| Layer | Thickness in microinches |
|---|---|
| PdNi Strike | 3 |
| Nickel | 20 |
| Pd | 3 |

Samples were tested for solderability as-plated and following 8 hours steam aging. Porosity testing was performed on sections cut from the same panel used for the solderability testing. The solderability and porosity performance results of the multiple layers are presented in Table II.

TABLE II

| | Comb. No. | | | |
|---|---|---|---|---|
| | 1 | 2 | 3 | 4 |
| % Coverage as-plated | 99 | 99 | 98 | 97 |
| % Coverage steam aged | 98 | 97 | 97 | 85 |
| Porosity count pores/cm$^2$ | 11 | 13 | 23 | >100 |

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. An IC package comprising at least one IC unit, and leads sealed within a protective package, in which said leads comprise a base metal, a layer of nickel on the base metal, and a composite of metal layers on top of nickel, said composite including, in succession from nickel, a palladium or soft gold strike layer, a palladium-nickel alloy layer having 10 to 90 weight percent nickel, by weight, a palladium layer, and a gold layer, in which said palladium or soft gold strike layer is deposited in a thickness sufficient to bond palladium-nickel alloy layer to the nickel layer, said palladium-nickel alloy layer is deposited in a thickness sufficient to at least slow down diffusion of base metal to the surface of the leads, said palladium layer is deposited in a thickness sufficient to at least slow down diffusion of nickel to the surface of the lead, and said outer gold layer is deposited in a thickness sufficient to further bar diffusion of any nickel to the surface of the lead.

2. The IC package of claim 1, in which said composite is deposited in a total thickness ranging from 10 to 300 microinches.

3. The IC package of claim 1, in which said composite is deposited in a minimum total thickness of 10 microinches.

4. The IC package of claim 1, in which said palladium or soft gold strike layer is at least 1 microinch in thickness, said palladium-nickel alloy layer is at least 4 microinches in thickness, said palladium layer is at least one microinch in thickness, and said outer gold layer is at least one microinch in thickness.

5. The IC package of claim 1, in which for use at temperatures at 250° C. and less, said palladium strike layer is at least 3 microinches in thickness, said palladium-nickel alloy layer is at least 4 microinches in thickness, said palladium layer is at least 3 microinches in thickness, and said outer gold layer is at least one microinch is in thickness.

6. The IC package of claim 1, in which for use at temperatures of 450° C. and greater said palladium or soft gold strike layer is within a range of from 1 to 5 microinches, and said palladium-nickel alloy layer, said palladium layer and said outer gold layer have a thickness falling within a range of at least 20–30 microinches each.

7. The IC package of claim 1, in which said base metal comprises copper and said Pd-Ni alloy contains 20 weight percent nickel.

8. The IC package of claim 1, in which said outer gold layer comprises soft gold strike.

9. A lead frame for providing an electrical contact to an integrated circuit unit, comprising a plurality of leads electrically connected to the integrated circuit, each lead comprising a base metal, a nickel layer on the base metal, and a composite of metal layers deposited on the nickel layer, wherein said composite comprises in succession from the nickel layer a palladium or soft gold strike layer, a palladium-nickel alloy layer having from 10 to 90% nickel, by weight, a palladium layer, and a gold layer, in which said palladium or soft gold strike layer is deposited in a thickness sufficient to bond palladium-nickel alloy layer to the nickel layer, said palladium-nickel alloy layer is deposited in a thickness sufficient to at least slow down diffusion of the base metal to the surface of the leads, said palladium layer is deposited in a thickness sufficient to at least slow down diffusion of nickel to the surface of the lead, and said gold layers in a thickness sufficient to further bar diffusion of any nickel to the surface of the lead.

10. The lead frame of claim 9, in which said composite is deposited in a total thickness ranging from 10 to 300 microinches.

11. The lead frame of claim 9, in which said composite is deposited in a minimum total thickness of at least 10 microinches.

12. The lead frame of claim 9, in which said palladium or soft gold strike layer is at least 1 microinch in thickness, said palladium-nickel alloy layer is at least 4 microinches in thickness, said palladium layer is at least one microinch in thickness, and said outer gold layer is at least one microinch in thickness.

13. The lead frame of claim 9, in which for use at temperatures at 250° C. and less, said palladium strike layer is at least 3 microinches in thickness, said palladium-nickel alloy layer is at least 4 microinches in thickness, said palladium layer is at least 3 microinches in thickness, and said outer gold layer is at least one microinch is in thickness.

14. The lead frame of claim 9, in which for use at temperatures of 450° C. and greater said palladium or soft gold strike layer is within a range of from 1 to 5 microinches, and said palladium-nickel alloy layer, said palladium layer and said outer gold layer have a thickness falling within a range of at least 20–30 microinches each.

15. The lead frame of claim 9, in which said base metal comprises copper and said Pd-Ni alloy contains 20 weight percent nickel.

16. The lead frame of claim 9, in which said outer gold layer comprises soft gold strike.

17. An article of manufacture comprising a base metal, a layer of nickel upon the base metal, and a composite of layers on the nickel layer, said composite including, in succession from the nickel layer, a palladium or soft gold strike layer, a palladium-nickel alloy layer having from 10 to 90% nickel by weight, a palladium layer and a gold layer, said palladium-nickel alloy being at least 4 microinches thick, and said palladium or gold strike layer, said palladium layer and said outer gold layer being at least one microinch each in thickness.

18. The article of claim 17, in which said composite is deposited in a total thickness ranging from 10 to 300 microinches.

19. The article of claim 17, in which said composite is deposited in a minimum total thickness of 10 microinches.

20. The article of claim 17, in which said palladium or soft gold strike layer is at least 1 microinch in thickness, said palladium-nickel alloy layer is at least 4 microinches in thickness, said palladium layer is at least one microinch in thickness, and said outer gold layer is at least one microinch in thickness.

21. The article of claim 17, in which for use at temperatures at 250° C. and less, said palladium or soft gold strike layer is at least 3 microinches in thickness, said palladium-nickel alloy layer is at least 4 microinches in thickness, said palladium layer is at least 3 microinches in thickness, and said outer gold layer is at least one microinch in thickness.

22. The article of claim 17, in which for use at temperatures of 450° C. and greater, said palladium or soft gold strike layer is within a range of from 1 to 5 microinches, and said palladium-nickel alloy layer, said palladium layer and said gold layer have a thickness falling within a range of at least 20–30 microinches each.

23. The article of claim 17, in which said base metal comprises copper and said Pd-Ni alloy contains 20 weight percent nickel.

24. The article of claim 17, in which said outer gold layer comprises soft gold strike.

* * * * *